(12) United States Patent
Galburt

(10) Patent No.: US 6,946,761 B2
(45) Date of Patent: Sep. 20, 2005

(54) ACTUATOR COIL COOLING SYSTEM

(75) Inventor: Daniel N. Galburt, Wilton, CT (US)

(73) Assignee: ASML Holding, N.V., Veldhoven (NL)

( * ) Notice: Subject to any disclaimer, the term of this patent is extended or adjusted under 35 U.S.C. 154(b) by 65 days.

(21) Appl. No.: 10/680,290

(22) Filed: Oct. 8, 2003

(65) Prior Publication Data
US 2004/0207273 A1 Oct. 21, 2004

Related U.S. Application Data
(60) Provisional application No. 60/463,688, filed on Apr. 18, 2003.

(51) Int. Cl.[7] .................................................. H02K 9/00
(52) U.S. Cl. ............................. 310/52; 310/54; 310/64
(58) Field of Search .............................. 310/52, 54, 58, 310/64

(56) References Cited
U.S. PATENT DOCUMENTS 4,874,916 A    10/1989  Burke ..................... 219/10.75
4,956,626 A     9/1990  Hoppe et al. ................. 336/60
5,140,204 A  *  8/1992  Cashmore et al. ............ 310/61
5,739,608 A  *  4/1998  Kim .......................... 310/90.5
6,371,028 B2 *  4/2002  Saxby ........................ 102/502
6,617,716 B2 *  9/2003  Ishida ........................ 310/58
6,661,124 B1 * 12/2003  Seki et al. ................... 310/12
6,809,441 B2 * 10/2004  Randall ...................... 310/54

FOREIGN PATENT DOCUMENTS
GB          714391 A    8/1954

* cited by examiner

Primary Examiner—Darren Schuberg
Assistant Examiner—Nguyen Hanh
(74) Attorney, Agent, or Firm—Sterne, Kessler, Goldstein & Fox P.L.L.C.

(57) ABSTRACT

An actuator coil with a race track winding that generates a magnetic field. A cooling tube has cooling liquid flowing therethrough and is wrapped around a periphery of said race track winding. A plurality of thermal conductive strips are arranged generally transverse to at least portions of said race track winding so as to conduct heat from said racetrack winding to said cooling tube.

23 Claims, 3 Drawing Sheets

ACTUATOR COIL COOLING SYSTEM

CROSS-REFERENCE TO RELATED APPLICATIONS

This application claims priority to U.S. Provisional Patent Application No. 60/463,688, Filed: Apr. 18, 2003, Titled: ACTUATOR COIL COOLING SYSTEM, which is incorporated by reference herein.

BACKGROUND OF THE INVENTION

1. Field of the Invention

The present invention relates to cooling actuator coils, and more particularly, to coils used in Lorenz force actuators and motors used in lithographic tools to levitate and drive stages.

2. Related Art

A Lorenz force actuator consists of two physically separate magnetic components. The first component is typically a drive coil through which a current is passed. The second component consists of an assembly of permanent magnets, often in combination with additional high permeability material, that together generates a strong magnetic field that passes through the coil. The interaction between the current flowing through the coil and the magnetic field generated by the permanent magnet assembly produces both a force on the coil, and an equal and opposite reaction force on the permanent magnet assembly. The portion of the coil in the strong magnetic field can be referred to as the active portion of the coil. Heat dissipated in the coil can cause an excessive rise in temperature, unless the coil is adequately cooled by conducting heat to a circulating cooling fluid.

In some cases, thin cooling jackets attached to the faces of the active portion of the coil are required to augment the flow of heat to the cooling fluid. Such cooling jackets are typically made of ceramics, such as silicon nitride, that offer a good combination of both high electrical resistivity and heat conductivity, and therefore efficiently transfer heat without causing undesirable eddy current damping effects due to the strong magnetic field.

Stainless steel is also used, but has neither high electrical resistivity nor high thermal conductivity. Fill polymers have high resistivity, but relatively poor thermal conductivity, and cannot, in general, be used to seal cooling water. Ceramics are brittle, expensive to manufacture, and might not (especially for thin sections) reliably carry the water without leakage.

SUMMARY OF THE INVENTION

The present invention is directed to an actuator coil cooling system that substantially obviates one or more of the problems and disadvantages of the related art.

An embodiment of the present invention includes a Lorentz actuator coil with a race track winding that has a cooling tube with liquid flowing through it wrapped around its periphery. A plurality of electrically insulated, metallic, thermal conductive strips are arranged generally transverse to active portions of the race track winding so as to conduct heat from the racetrack winding to the cooling tube with introducing significant eddy current effects In another aspect, there is provided a coil plate assembly including a base plate. A cooling tube has a cooling fluid flowing therethrough. A plurality of race track coils are arranged symmetrically around the base plate and perpendicular to the base plate. Each race track coil includes a race track winding that generates a magnetic field. The cooling tube is wrapped around a periphery of the race track winding. Each race track coil further includes a plurality of thermal conductive strips arranged generally transverse to at least portions of the race track winding so as to conduct heat from the racetrack winding to the cooling tube.

Additional features and advantages of the invention will be set forth in the description that follows, and in part will be apparent from the description, or may be learned by practice of the invention. The advantages of the invention will be realized and attained by the structure and particularly pointed out in the written description and claims hereof as well as the appended drawings.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to illustrate exemplary embodiments of the invention and are incorporated in and constitute a part of this specification, illustrate embodiments of the invention and together with the description serve to explain the principles of the invention. In the drawings.

DETAILED DESCRIPTION OF EMBODIMENTS OF THE INVENTION

Reference will now be made in detail to the embodiments of the present invention, examples of which are illustrated in the accompanying drawings.

A number of applications exist for the present invention. These include electromagnetic force actuators, and linear motors used in precision wafer and reticle stages, such as those used in semiconductor manufacturing, although the invention is not limited to these applications.

In a typical photolithographic tool, the wafer is mounted on a stage, and has several degrees of freedom, X, Y, Z, and possibly some degrees of rotational freedom. Some systems also include wafer stages that have a long stroke stage that operates in conjunction with a magnetically levitated short stroke stage. The long stroke stage is typically guided by conventional bearings and driven by linear motors, and provides large-scale X, Y motion. The short stroke stage is servo-controlled to provide ultra-precise positioning in six degrees of freedom. In such systems, the wafer itself is mounted on an electro-magnetically levitated, monolithic component of the short stroke stage. This monolithic component includes permanent magnets that generate strong magnetic fields that interact with short stroke actuator coils that are part of a separate coil plate assembly. The short stroke coil plate assembly is typically mounted on top of the moving component of the long stroke stage. Lorenz coils are frequently used in such actuator applications, and due to the requirements for high current and strong magnetic fields are not easily cooled.

The generation of heat by Lorenz actuators frequently causes distortions and difficulties in wafer alignment. This is particularly true with short-stroke actuator assemblies, which need to be in very close proximity to the wafer itself.

Figure 1:
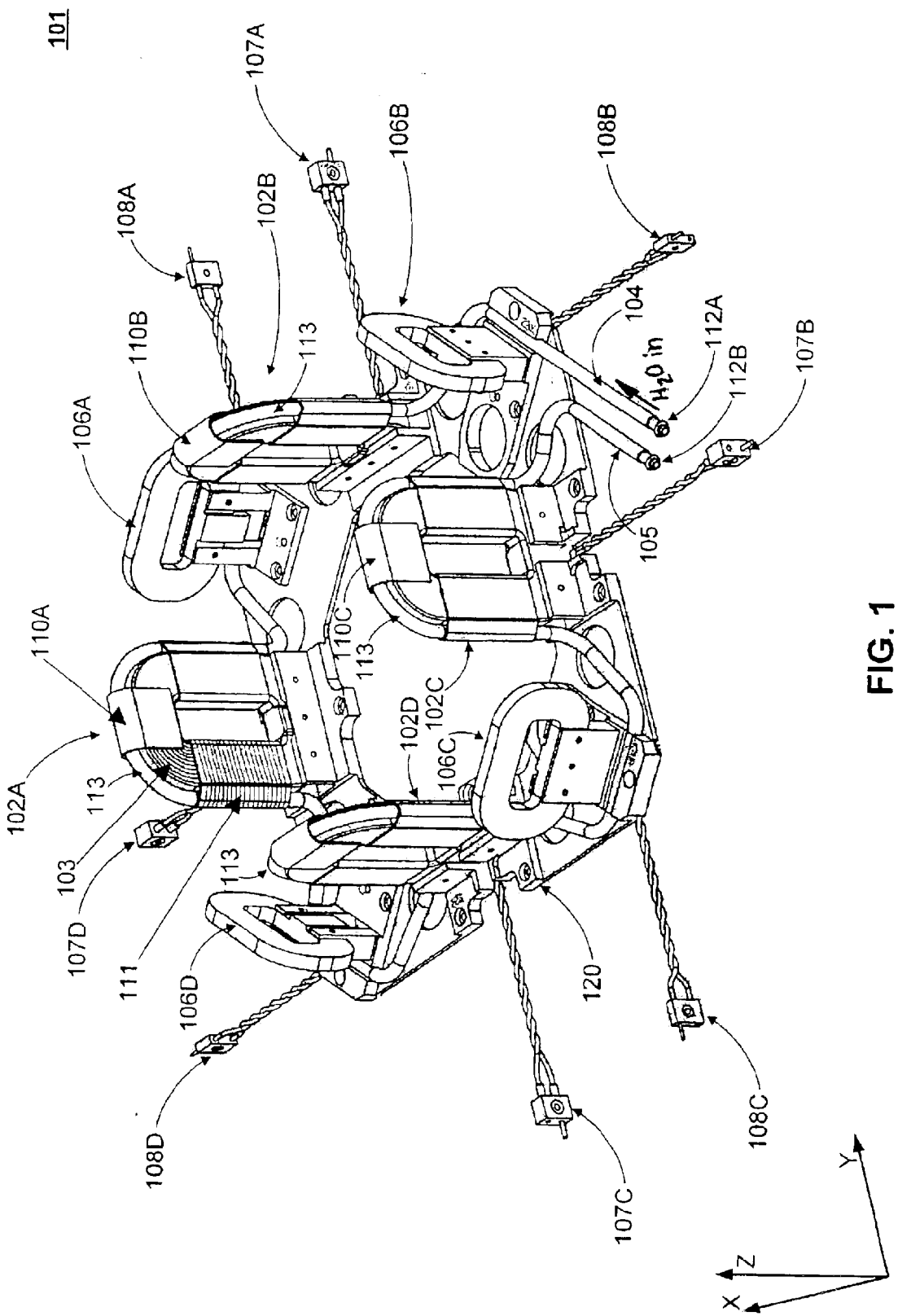
FIG. 1 illustrates a short stroke coil plate assembly of one embodiment of the present invention.

Electrically conductive coil or a series of electrically conductive strips may be used to transfer actuator coil heat to water cooling tubes located outside the area that has the highest magnetic field strength. Either a coil wound with insulated copper or aluminum wire, or a series of insulated copper or aluminum strips, efficiently conduct heat without introducing eddy current damping. FIG. 1 illustrates one such technique. A thin walled stainless steel water cooling tube is wrapped around the outside of an actuator coil on three sides. Insulated copper or aluminum wire is wrapped around both the coil and the cooling tubes. The ends of the resulting coil are electrically isolated so that the electromotive force (EMF) developed in the coil produces no loop current. By using a reasonable wire size, eddy currents in the wire are minimized. In the case of aluminum wire, aluminum oxide can be used to provide sufficient insulation while maximizing heat transfer.

As may be further seen in FIG. 1, a short stroke coil plate assembly 101 includes a base plate 120. Although not shown in this figure, the wafer is mounted on a monolithic block directly above it. Magnetic components in the monolithic block (such as NdFeB magnets) generate an intense magnetic field that interacts with the current flowing through the coils, generating the Lorenz forces on the monolithic block that control its motion. As further shown in FIG. 1, the assembly 101 includes a plurality of actuator coil assemblies 102A–102D, arranged (in this example) in a square pattern. Each actuator coil assembly 102 includes a racetrack-wound coil 103 (only one coil 103 is shown in FIG. 1 for clarity). Instead of a racetrack winding, a flat coil, or overlapping coils, may be used. Heat transfer strips 111 are arranged in contact with the coil 103. The racetrack coil 103 may also be referred to as an actuator drive coil. Collectively, the actuator coil assemblies 102A–102D provide for motion in the X, Y plane, including rotation.

A cooling tube 113 is "wrapped" around three sides of the periphery of each actuator coil assembly 102. In this embodiment, a single cooling tube 113 is used to cool all four coils. The cooling tube 113 includes an input fluid connecting portion 104, and an output fluid connecting portion 105. Connection ports 112A, 112B are used to connect to a fluid supply system (not shown in this figure). Electrical connectors 107A–107D are used to supply current to the actuator coil assemblies 102A–102D, respectively.

Cooling jackets 110A–110D are also used to conduct the heat from the racetrack coils 103 to the cooling tube 113. Note that the cooling jacket 110 is located in an area where the magnetic force is not as strong as elsewhere in the actuator coil assemblies 102. Therefore, the problems caused by eddy currents are minimized.

Note further that although the actuator coil assemblies 102A–102D are shown as having a center opening, which is preferred to reduce unwanted acoustic coupling, it is also possible to not have such an opening.

The assembly 101 also includes four focusing coils 106A–106C, which are used for Z-axis positioning of the monolithic block on which the wafer rests. Connectors 108A–108D are used to supply current to the focusing actuators 106A–106D, respectively. Since the amount of Z-axis motion is usually relatively small, the focusing coils 106A–106C may be relatively small as well. The position of the wafer in X, Y, Z space is thus magnetically controlled through the use of the actuator coil assemblies 102 and the focusing coils 106.

Note also that ethylene glycol may be used, in addition to water, as the cooling fluid that flows through the cooling tube 113. Note also that in the embodiment of FIG. 1, the thermal conductive strips 111 are wound into a coil pattern. The thermal conductive strips 111 may be made of any metal, including relatively soft metals that are easy to work with, such as copper, stainless steel, gold, aluminum, etc. Alternatively, graphite or graphite fibers may be used. Note also that the thermal conductive strips 111 transfer heat through conduction, rather than convection (where convection involves the physical transport of fluid or other medium).

Although four drive coils and four focusing coils are shown in FIG. 1, it will be appreciated that more or fewer may be used. For example, in the case of a reticle stage, where this invention is also applicable, only two actuator coil assemblies 102 may be used (or in some cases, only one, where the sole adjustment is along one axis, in other words, only a single degree of freedom is necessary).

Figure 3:
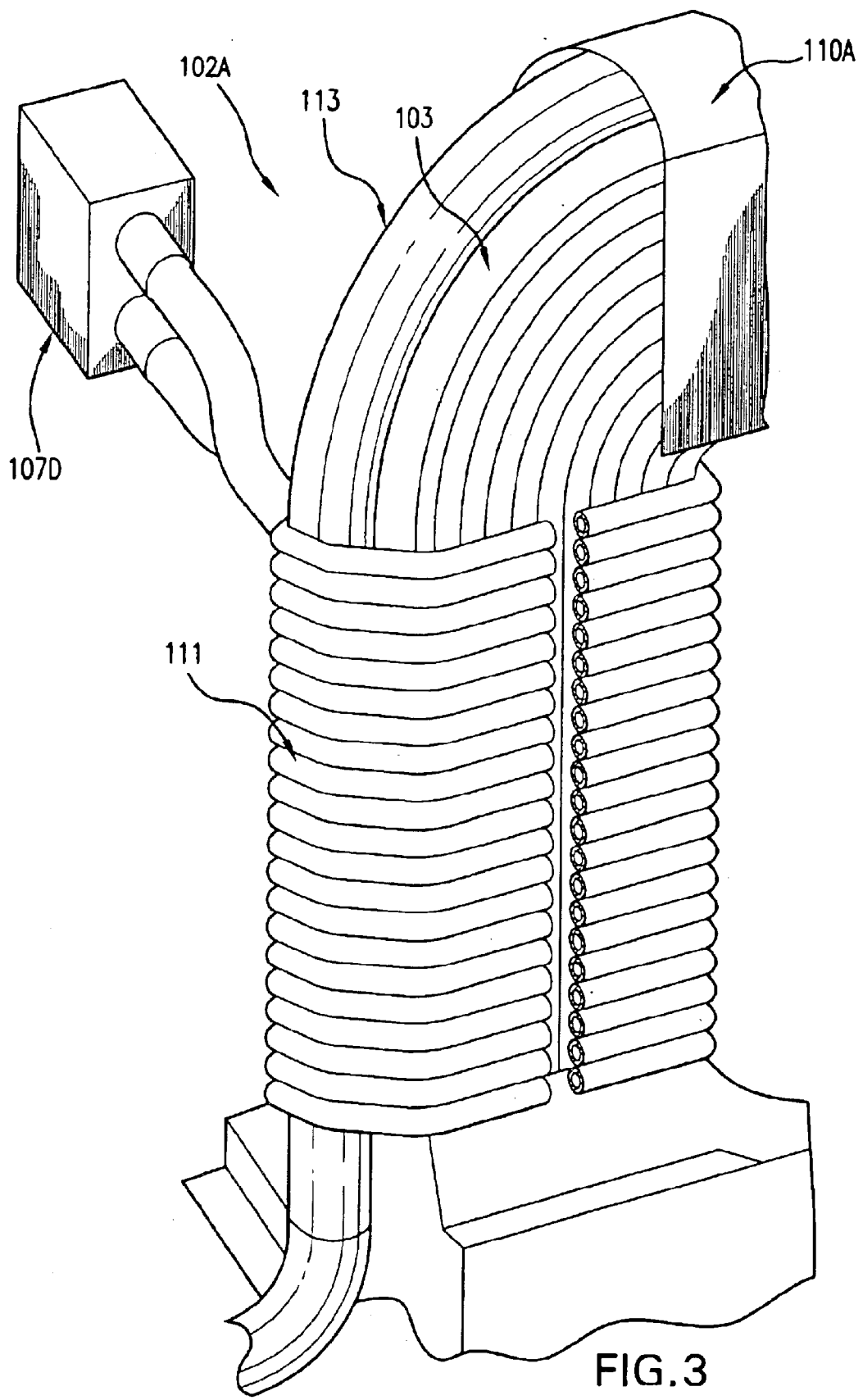
FIG. 3 shows additional detail of a single coil.

As an alternative, it is possible to have the strips 111 as small tubes, through which cooling fluid flows. (See FIG. 3) In either case, the direction of the heat transfer is generally transverse to the direction of the racetrack winding.

As another alternative, it is possible to use a series of stacked insulated wire staples in place of the continuous coil winding of the strips 111.

Figure 2:
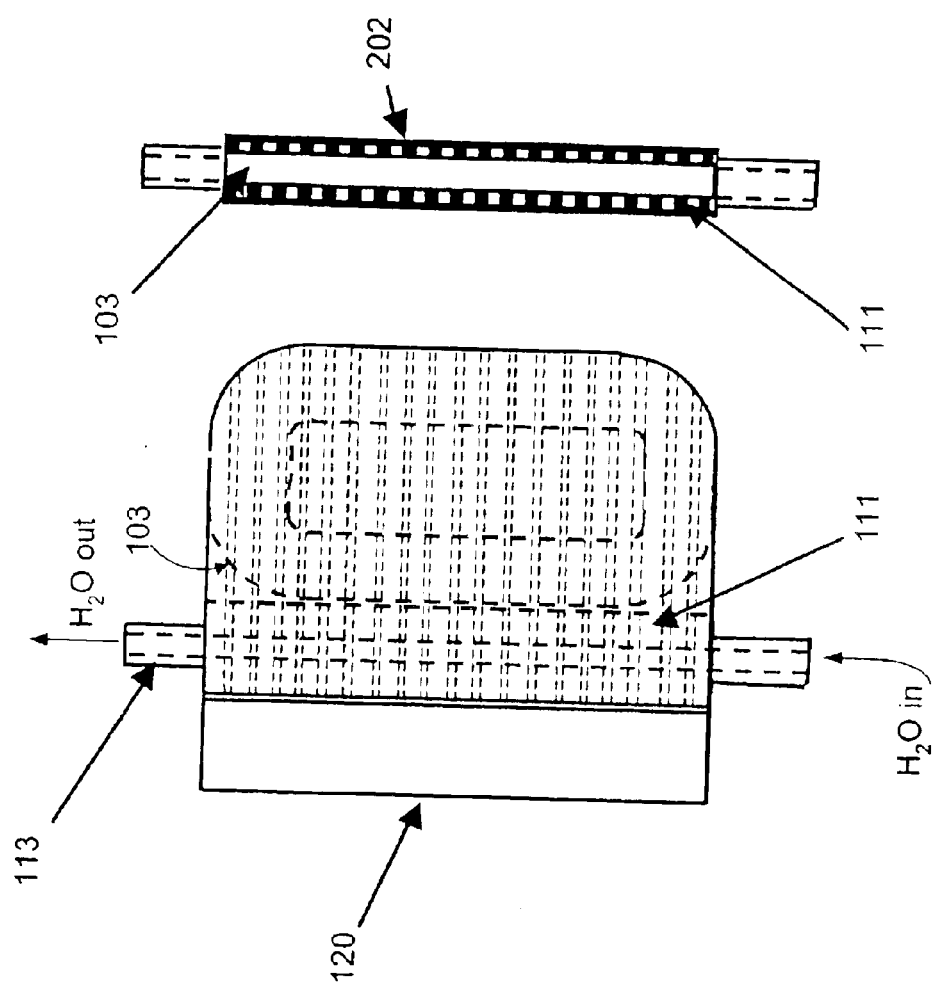
FIG. 2 illustrates another embodiment of a coil assembly of the present invention.

Another embodiment, illustrated in FIG. 2, uses a series of copper or aluminum strips attached to a thin electrically insulating fiberglass plate. The strips are cemented to both the actuator drive coil surface and the water cooling tube. The common elements with FIG. 1 have been labeled identically. Additionally, a thin fiberglass sheet 202 is used as an electrical insulator. Furthermore, the thermal conductive strips 111 are not wound into a coil, but are laid side-by-side. As in FIG. 1, the direction of heat transfer is generally transverse to the direction of the racetrack winding of the coil 103.

Further, with regard to FIG. 2, the fiberglass sheeting 201 may be peeled off during manufacturing, or it may be left in place, to minimize manufacturing costs.

The proposed approach is less costly to manufacture than conventional art, and may improve both performance and reliability.

It will be understood by those skilled in the art that various changes in form and details may be made therein without departing from the spirit and scope of the invention as defined in the appended claims. Thus, the breadth and scope of the present invention should not be limited by any of the above-described exemplary embodiments, but should be defined only in accordance with the following claims and their equivalents.

What is claimed is:

1. An actuator comprising:
   a coil of wire carrying current to form a magnetic field generated by separate magnetic components;
   a cooling tube having cooling liquid flowing therethrough in proximity of the coil of wire but outside the coil of wire, and wrapped around a periphery of said coil of wire; and
   a plurality of thermal conductive strips arranged generally transverse to at least portions of said coil of wire and in contact with said portions of said coil so as to conduct heat from said coil of wire to said cooling tube.

2. The actuator coil of claim 1, further comprising a cooling jacket around one side of said coil of wire and around said cooling tube.

3. The actuator coil of claim 1, wherein said plurality of thermal conductive strips are arranged in a coil.

4. The actuator coil of claim 1, wherein said plurality of thermal conductive strips are arranged side-by-side and in contact with each other.

5. The actuator coil of claim 1, wherein each of said plurality of thermal conductive strips includes a microtube with a cooling liquid flowing therethrough.

6. The actuator coil of claim 1, wherein said plurality of thermal conductive strips are formed of a metal.

7. The actuator coil of claim 1, wherein said plurality of thermal conductive strips are formed of any one of steel, gold, aluminum, copper, graphite and graphite fibers.

8. The actuator coil of claim 1, wherein said coil of wire is a racetrack winding.

9. The actuator coil of claim 1, wherein said coil of wire is a flat coil.

10. The actuator coil of claim 1, wherein said coil of wire is a plurality of overlapping coils.

11. A coil plate assembly comprising:
- a base plate;
- a cooling tube having a cooling fluid flowing therethrough;
- a plurality of coil windings arranged symmetrically around said base plate and perpendicular to said base plate, each coil winding generating a magnetic field, wherein said cooling tube is wrapped around three sides of a periphery of said coil winding;
- each coil winding further including a plurality of thermal conductive strips arranged generally transverse to at least portions of said race track winding so as to conduct heat from said coil winding to said cooling tube.

12. The coil plate assembly of claim 11, further comprising a plurality of focusing coils mounted on said base plate.

13. The coil plate assembly of claim 11, further comprising a cooling jacket around one side of said coil winding and around said cooling tube.

14. The coil plate assembly of claim 11, wherein said plurality of thermal conductive strips are arranged in a coil.

15. The coil plate assembly of claim 11, wherein said plurality of thermal conductive strips are arranged side-by-side and adjacent to each other.

16. The coil plate assembly of claim 11, wherein each of said plurality of thermal conductive strips includes a microtube with a cooling liquid flowing therethrough.

17. The coil plate assembly of claim 11, wherein said plurality of thermal conductive strips are formed of a metal.

18. The coil plate assembly of claim 11, wherein said plurality of thermal conductive strips are formed of any one of steel, gold, aluminum, copper, graphite and graphite fibers.

19. The coil plate assembly of claim 11, wherein said plurality of thermal conductive strips includes a plurality of stacked insulated wire staples.

20. The actuator coil of claim 11, wherein said coil of wire is a racetrack winding.

21. The actuator coil of claim 11, wherein said coil of wire is a flat coil.

22. The actuator coil of claim 11, wherein said coil of wire is a plurality of overlapping coils.

23. A motor coil comprising:
- a coil of wire carrying current to form a magnetic field generated by separate magnetic components;
- a cooling tube having cooling liquid flowing therethrough in proximity of the coil of wire but outside the coil of wire, and wrapped around three sides of said coil of wire; and
- a plurality of thermal conductive strips in contact with each other and arranged generally transverse to at least portions of said coil of wire so as to conduct heat from said coil of wire to said cooling tube.

* * * * *